(12) United States Patent
Wang et al.

(10) Patent No.: US 8,519,420 B2
(45) Date of Patent: Aug. 27, 2013

(54) LIGHT EMITTING DIODE PACKAGE

(75) Inventors: Kai-Lun Wang, Hsinchu (TW); Hou-Te Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 43 days.

(21) Appl. No.: 13/186,483

(22) Filed: Jul. 20, 2011

(65) Prior Publication Data

US 2012/0132942 A1     May 31, 2012

(30) Foreign Application Priority Data

Nov. 30, 2010 (CN) .......................... 2010 1 0564438

(51) Int. Cl.
*H01L 33/50* (2010.01)
(52) U.S. Cl.
USPC ................ 257/98; 257/79; 257/E33.059
(58) Field of Classification Search
USPC ...................... 257/79, 98, E33.059
See application file for complete search history.

(56) References Cited

U.S. PATENT DOCUMENTS

| 7,985,980 B2 * | 7/2011 | Matsuda et al. ............... 257/98 |
| 2005/0280017 A1 | 12/2005 | Oshio et al. |
| 2006/0043382 A1 | 3/2006 | Matsui et al. |
| 2011/0244606 A1 | 10/2011 | Matsuda et al. |
| 2013/0020604 A1 | 1/2013 | Seo |

FOREIGN PATENT DOCUMENTS

| CN | 1707825 A | 12/2005 |
| CN | 101488546 A | 7/2009 |
| TW | 200939541 | 9/2009 |

\* cited by examiner

*Primary Examiner* — Roy Potter
(74) *Attorney, Agent, or Firm* — Altis Law Group, Inc.

(57) ABSTRACT

An exemplary LED package includes first and second electrodes, an LED chip and two electrically conductive wires. The first electrode has a top surface and an opposite bottom surface. A recess is defined in the top surface of the first electrode. The second electrode has a top surface and an opposite bottom surface. A recess is defined in the top surface of the second electrode. The LED chip has a bottom surface attached to the top surface of the first electrode, and a top surface on which a first pad and a second pad are formed. One of the electrically conductive wires has an end connecting to the first pad and an opposite end joining with a bottom of the recess of the first electrode. The other has an end connecting to the second pad and an opposite end joining with a bottom of the recess of the second electrode.

19 Claims, 4 Drawing Sheets

LIGHT EMITTING DIODE PACKAGE

BACKGROUND

1. Technical Field

The present disclosure relates generally to light emitting devices, and more particularly to a light emitting diode (LED) package.

2. Description of Related Art

LEDs are solid state light emitting devices formed of semiconductors, which are more stable and reliable than other conventional light sources such as incandescent bulbs. Thus, LEDs are being widely used in various fields such as numeral/character displaying elements, signal lights, light sources for lighting and display devices. When in use, providing LEDs in packages can provide protection, color selection, focusing and the like for light emitted by the LEDs.

A typical LED package includes a base with an LED chip encapsulated thereon. The LED chip is electrically connected to electrical structures formed on the base by wire bonding. The wires connected between the LED chip and the electrical structures are usually curved, for obtaining a certain degree of stretchiness, which preventing the wire from splintering. However, restricting by the technological level of wire bonding, the curved wires are much higher as desired. Thus, a height of the LED package cannot be controlled in a desired extent.

What is needed therefore is an LED package which can overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
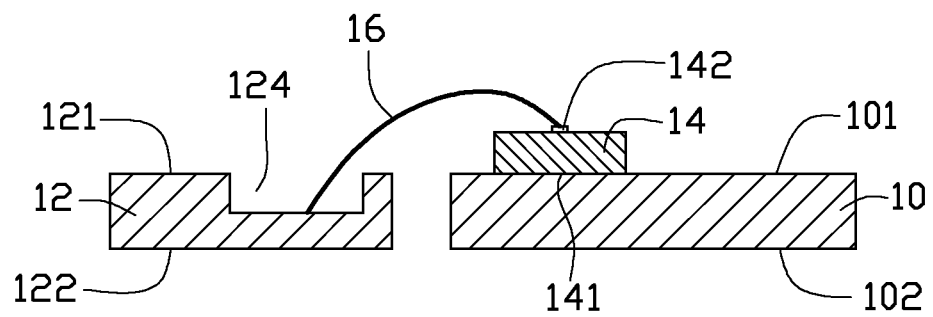
FIG. 1 is a schematic, cross sectional view of an LED package in accordance with a first embodiment of the present disclosure.

FIG. 1 illustrates an LED package in accordance with a first embodiment of the present disclosure. The LED package comprises a first electrode 10, a second electrode 12, an LED chip 14 and an electrically conductive wire 16.

The first electrode 10 is a rectangular block. The first electrode 10 has a top surface 101 and an opposite bottom surface 102.

The second electrode 12 is a rectangular block. The second electrode 12 has a top surface 121 and an opposite bottom surface 122. The top surface 121 of the second electrode 12 is level with the top surface 101 of the first electrode 10. The bottom surface 122 of the second electrode 12 is level with the bottom surface 102 of the first electrode 10. The second electrode 12 is electrically isolated from the first electrode 10. A recess 124 is depressed downwardly from the top surface 121 of the second electrode 12 for positioning one end of the electrically conductive wire 16 therein. It is noted that the number of the recess 124 can be altered according to the number of the electrically conductive wire 16.

The LED chip 14 may be a GaN compound LED chip. The LED chip 14 may include multiple layers such as N-type layer, active layer, and P-type layer. The LED chip 14 has a first pad 141 and a second pad 142 which have opposite polarities. The first pad 141 is positioned at a bottom surface of the LED chip 14. The second pad 142 is positioned at a top surface of the LED chip 14. In other words, the LED chip 14 is a vertical type LED chip. The LED chip 14 is mounted on the first electrode 10. The first pad 141 is connected to the top surface 101 of the first electrode 10. The second pad 142 of the LED chip 14 is electrically connected to the second electrode 12 via the electrically conductive wire 16. Specifically, one end of the electrically conductive wire 16 is connected to the second pad 142 of the LED chip 14, and an opposite end of the electrically conductive wire 16 has a joint with the second electrode 12 at a bottom of the recess 124. After the first and second electrodes 10, 12 connecting to a power source, the LED chip 14 can emit light.

Figure 2:
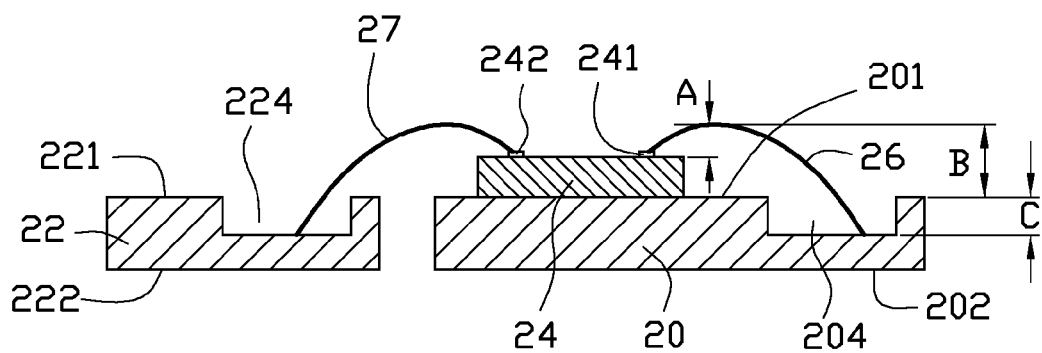
FIG. 2 is a schematic, cross sectional view of an LED package in accordance with a second embodiment of the present disclosure.

Referring to FIG. 2, an LED package in accordance with a second embodiment of the present disclosure is shown. The LED package comprises a first electrode 20, a second electrode 22, an LED chip 24 and two electrically conductive wires 26, 27.

The first electrode 20 is a rectangular block. The first electrode 20 has a top surface 201 and an opposite bottom surface 202. A recess 204 is depressed downwardly from the top surface 201 of the first electrode 20 for positioning one end of the electrically conductive wire 26 therein.

The second electrode 22 is a rectangular block. The second electrode 22 has a top surface 221 and an opposite bottom surface 222. The top surface 221 of the second electrode 22 is level with the top surface 201 of the first electrode 20. The bottom surface 222 of the second electrode 22 is level with the bottom surface 202 of the first electrode 20. The second electrode 22 is electrically isolated from the first electrode 20. A recess 224 is depressed downwardly from the top surface 221 of the second electrode 22 for positioning one end of the electrically conductive wire 27 therein. The depth of the recess 224 is substantially identical to that of the recess 204.

The LED chip 24 has a first pad 241 and a second pad 242 having a polarity opposite to that of the first pad 241. Both of the first and second pads 241, 242 are positioned at a top surface of the LED chip 24. In other words, the LED chip 24 is a lateral type LED chip. The LED chip 24 is mounted on the top surface 201 of the first electrode 20. The first pad 241 is electrically connected to the first electrode 20 via the electrically conductive wire 26. Specifically, one end of the electrically conductive wire 26 is connected to the first pad 241 of the LED chip 24, and an opposite end of the electrically conductive wire 26 has a joint with the first electrode 20 at a bottom of the recess 204. The second pad 242 of the LED chip 24 is electrically connected to the second electrode 22 via the electrically conductive wire 27. Specifically, one end of the electrically conductive wire 27 is connected to the second pad 242 of the LED chip 24, and an opposite end of the electrically conductive wire 27 has a joint with the second electrode 22 at a bottom of the recess 224.

The electrically conductive wires 26, 27 are curved. A distance between a top point of the electrically conductive wire 26 and the top surface of the LED chip 24 is defined as A. A distance between the top point of the electrically conductive wire 26 and the top surface 201 of the first electrode 20 is defined as B. A distance between the top surface 201 of the first electrode 20 and the bottom of the recess 204, i.e., a depth of the recess 204, is defined as C. A, B and C satisfy the following inequality: B>C>A.

The LED package provided by the present invention has a smaller height compared with conventional LED packages, since the curved electrically conductive wires 16, 26, 27 has a lower joint with the electrodes 12, 20, 22 benefiting from the formation of the recesses 124, 204, 224. The joint is lower than the bottom surface of the LED chip 14, 24. A reduced height of the LED package provided by the present invention is at least equal to a distance of the depth C.

Figure 3:
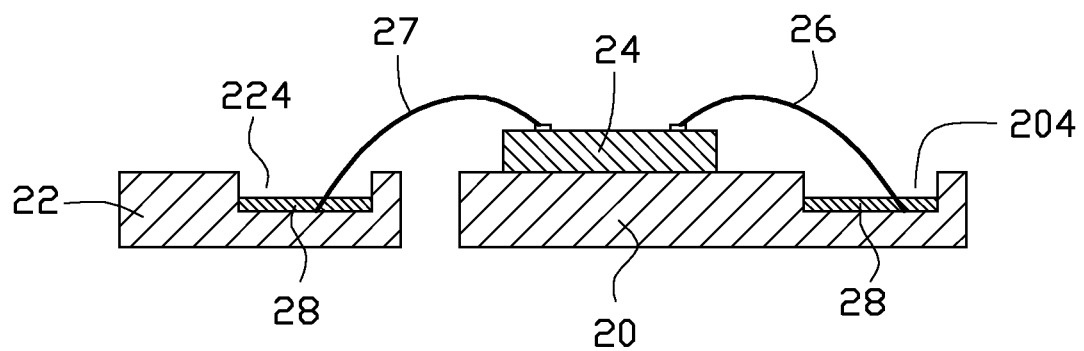
FIG. 3 is a schematic, cross sectional view of an LED package in accordance with a third embodiment of the present disclosure.

Referring to FIG. 3, a covering layer 28 can be formed on each of the bottoms of the recesses 204, 224. The covering layer 28 is coated on each of the joints of the electrically conductive wires 26, 27 and the first and second electrodes 20, 22, for increasing a connection strength of the electrically conductive wires 26, 27 and the first and second electrodes 20, 22. The covering layer 28 can be metal or conductive silver glue.

Figure 4:
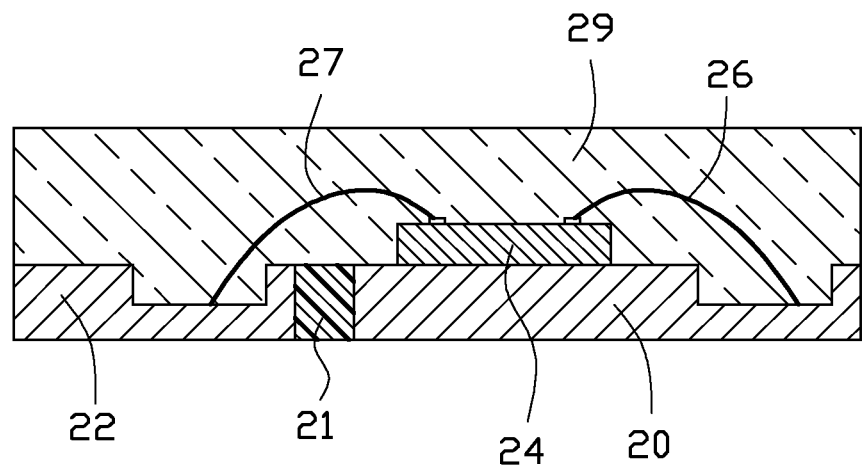
FIG. 4 is a schematic, cross sectional view of an LED package in accordance with a fourth embodiment of the present disclosure.

Referring to FIG. 4, the LED package further comprises an insulating layer 21 formed between the first and second electrodes 20, 22 for electrically insulating the first and second electrodes 20, 22.

An encapsulant 29 is formed on the first and second electrodes 20, 22 and encapsulating the LED chip 24. The encapsulant 29 is transparent or translucent, and may be made of resins, glass or other suitable materials. The encapsulant 29 can be configured as spherical, elliptical, or rectangular. The encapsulant 29 may contain phosphors therein, or may be coated with a phosphor layer.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A light emitting diode (LED) package comprising:
a first electrode and a second electrode insulating from the first electrode, a first recess being defined in the first electrode, and a second recess being defined in the second electrode;
an LED chip mounted on the first electrode, the LED chip having a first pad and a second pad with opposite polarities, and the first pad and the second pad being positioned on a top surface of the LED chip; and
a first electrically conductive wire and a second electrically conductive wire, the first electrically conductive wire having one end connecting to the first pad of the LED chip, and an opposite end joining with the first electrode at a bottom of the first recess, and the second electrically conductive wire having one end connecting to the second pad and an opposite end joining with the second electrode at a bottom of the second recess.

2. The LED package of claim 1, wherein a covering layer is coated on a joint between the first electrically conductive wire and the first electrode and a joint between the second electrically conductive wire and the second electrode.

3. The LED package of claim 2, wherein the covering layer is made of metal or conductive silver glue.

4. The LED package of claim 1, wherein the first electrically conductive wire is curved, a distance between a top point of the first electrically conductive wire and a top surface of the first electrode is larger than that between the top surface of the first electrode and the bottom of the first recess, and a distance between the top surface of the first electrode and the bottom of the first recess is larger than that between the top point of the first electrically conductive wire and the top surface of the LED chip.

5. The LED package of claim 1 further comprising an encapsulant positioned on the first and second electrodes and encapsulating the LED chip.

6. The LED package of claim 5, wherein the encapsulant contains phosphors therein, or a phosphor layer is coated on the encapsulant.

7. The LED package of claim 1 further comprising an electrically insulating layer positioned between the first and second electrodes and connecting therewith.

8. An LED package comprising:
a first electrode having a top surface and an opposite bottom surface, a recess being depressed downwardly from the top surface of the first electrode;
a second electrode having a top surface and an opposite bottom surface, a recess being depressed downwardly from the top surface of the second electrode;
an LED chip with a bottom surface mounted on the top surface of the first electrode, a first pad and a second pad being formed on a top surface of the LED chip;
two electrically conductive wires, one having an end connecting to the first pad and an opposite end joining with the first electrode at a bottom of the recess thereof, and the other having an end connecting to the second pad and an opposite end joining with the second electrode at a bottom of the recess thereof and
an encapsulant positioned on the first and second electrodes and encapsulating the LED chip, the encapsulant containing phosphors therein, or a phosphor layer being coated on the encapsulant.

9. The LED package of claim 8, wherein the top surface of the first electrode is level with the top surface of the second electrode, and the bottom surface of the first electrode is level with the bottom surface of the second electrode.

10. The LED package of claim 8, wherein a depth of the recess of the first electrode is identical to that of the recess of the second electrode.

11. The LED package of claim 8, wherein the electrically conductive wires are curved, a distance between a top point of a corresponding electrically conductive wire and a top surface of the first electrode is larger than that between the top surface of the first electrode and the bottom of the recess of the first electrode, and a distance between the top surface of the first electrode and the bottom of the recess of the first electrode is larger than that between the top point of the corresponding electrically conductive wire and the top surface of the LED chip.

12. The LED package of claim 8 further comprising an insulating layer positioned between the first and second electrodes for electrically isolating the first and second electrodes.

13. An LED package comprising:
an LED chip comprising a top surface, a bottom surface and a pad formed on the top surface;
an electrode for connecting the LED package to an power source; and
an electrically conductive wire having a first end connected to the pad of the LED chip and a second end connected to the electrode, a joint of the second end of the electrically conductive wire and the electrode being lower than the bottom surface of the LED chip.

14. The LED package of claim 13, wherein the electrode comprises a top surface and a bottom surface opposite to the top surface, the top surface of the electrode being substantially coplanar with the bottom surface of the LED chip, a recess being defined in the top surface of the electrode, the joint of the second end of the electrically conductive wire and the electrode being located at a bottom of the recess.

15. A light emitting diode (LED) package comprising:
a first electrode and a second electrode insulating from the first electrode, at least one recess being defined in the second electrode;
an LED chip mounted on the first electrode, the LED chip having a first pad and a second pad with opposite polarities; and
at least one electrically conductive wire with one end connecting to one of the first and second pads of the LED chip, and an opposite end joining with the second electrode at a bottom of the at least one recess;
wherein the at least one electrically conductive wire is curved, a distance between a top point of the at least one electrically conductive wire and a top surface of the first electrode is larger than that between the top surface of the first electrode and the bottom of the corresponding recess, and a distance between the top surface of the first electrode and the bottom of the corresponding recess is larger than that between the top point of the at least one electrically conductive wire and a top surface of the LED chip.

16. The LED package of claim 15, wherein a covering layer is coated on a joint between the at least one electrically conductive wire and the second electrode.

17. The LED package of claim 16, wherein the covering layer is made of metal or conductive silver glue.

18. The LED package of claim 15 further comprising an encapsulant positioned on the first and second electrodes and encapsulating the LED chip.

19. The LED package of claim 18, wherein the encapsulant contains phosphors therein, or a phosphor layer is coated on the encapsulant.

* * * * *